US012750979B2

(12) United States Patent
Pitts

(10) Patent No.: US 12,750,979 B2
(45) Date of Patent: Sep. 29, 2026

(54) CLAMPED ANNEALED PYROLYTIC GRAPHITE HEAT SPREADING

(71) Applicant: Raytheon Company, Waltham, MA (US)

(72) Inventor: Andrew J. Pitts, Newton, MA (US)

(73) Assignee: RAYTHEON COMPANY, Waltham, MA (US)

( * ) Notice: Subject to any disclaimer, the term of this patent is extended or adjusted under 35 U.S.C. 154(b) by 890 days.

(21) Appl. No.: 17/991,138

(22) Filed: Nov. 21, 2022

(65) Prior Publication Data

US 2024/0172399 A1 May 23, 2024

(51) Int. Cl.
*H05K 7/20* (2006.01)

(52) U.S. Cl.
CPC ................................ *H05K 7/20509* (2013.01)

(58) Field of Classification Search
CPC ............................... H01L 23/373; F28F 21/02
See application file for complete search history.

(56) References Cited

U.S. PATENT DOCUMENTS 5,296,310 A 3/1994 Kibler et al.
2005/0064230 A1 3/2005 Sayir et al.
2007/0053168 A1 3/2007 Sayir et al.
2008/0066676 A1* 3/2008 Mariner ............ H01L 21/68785 118/724
2014/0262192 A1* 9/2014 Boday ........................ C09J 5/06 252/78.3
2020/0091035 A1 3/2020 Gupta et al.
2021/0242049 A1* 8/2021 Natarajan ............. H01L 23/345

FOREIGN PATENT DOCUMENTS

EP 3726572 A1 10/2020
EP 2901826 B1 12/2020

OTHER PUBLICATIONS

Bagheri et al. "Utilization of orthotropic graphite plates in plate heat exchangers, analytical modeling" International Journal of Heat and Mass Transfer 77 (Jun. 2014): pp. 301-310.
Gurpinar et al. "Analysis and evaluation of thermally annealed pyrolytic graphite heat spreader for power modules" 2020 IEEE Applied Power Electronics Conference and Exposition (APEC). IEEE, (Mar. 2020) pp. 2741-2747.
International Search Report with Written Opinion issued in International Application No. PCT/US2023/036661; International Filing Date Nov. 2, 2023; Date of Mailing Feb. 16, 2024 (14 pages).

(Continued)

*Primary Examiner* — Jianying C Atkisson
*Assistant Examiner* — Khaled Ahmed Ali Al Samiri
(74) *Attorney, Agent, or Firm* — CANTOR COLBURN LLP

(57) ABSTRACT

A heat spreader is provided and includes a core of orthotropic material having first and second preferred directions of thermal conduction, a top plate, a bottom plate and pyrolytic graphite sheets (PGSs). The PGSs are interposed in a compressed state as a thermal interface material (TIM) between the core and the top plate and between the core and the bottom plate in a compression direction aligned with at least one of the first and second preferred directions of thermal conduction.

13 Claims, 7 Drawing Sheets

(56) References Cited

OTHER PUBLICATIONS

Lemak "Pyrolytic Graphite Heat Spreader Options for High Performance Embedded Components and Systems" Proceedings of IMAPS Advanced Technology Workshop on Thermal Management, (Sep. 2006) pp. 1-22.

Silverman "Product development of engineered thermal composites for cooling spacecraft electronics" Northrop Grumman Technology Review Journal 13.2 (2005) pp. 1-19.

* cited by examiner

CLAMPED ANNEALED PYROLYTIC GRAPHITE HEAT SPREADING

BACKGROUND

The present disclosure relates to heat spreading and, in particular, to a clamped annealed pyrolytic graphite heat spreader A heat spreader is an assembly that is used to transfer heat, which is generated by an electronic device or module, from the electronic device or module in a first direction and to spread that heat out in second directions. In some cases, the heat spreader includes the module, a cold plate or a heat exchanger, and a heat spreading element interposed between the module and the cold plate. The heat spreading element transfers heat generated by the module toward the cold plate and in doing so spreads the heat out.

In conventional heat spreaders, the heat spreading element was provided by monolithic copper spreaders. These monolithic copper spreaders tend to be heavy. As such, conventional heat spreaders that include monolithic copper spreaders tend to be heavy as well.

SUMMARY

According to an aspect of the disclosure, a heat spreader is provided and includes a core of orthotropic material having first and second preferred directions of thermal conduction, a top plate, a bottom plate and pyrolytic graphite sheets (PGSs). The PGSs are interposed in a compressed state as a thermal interface material (TIM) between the core and the top plate and between the core and the bottom plate in a compression direction aligned with at least one of the first and second preferred directions of thermal conduction.

In accordance with additional or alternative embodiments, the orthotropic material includes annealed pyrolytic graphite (APG).

In accordance with additional or alternative embodiments, the first and second preferred directions of thermal conduction are in-plane directions of the core.

In accordance with additional or alternative embodiments, the top and bottom plates are aligned in a through-thickness direction and the core is rotated such that the at least one of the first and second preferred directions of thermal conduction is aligned with the through-thickness direction.

In accordance with additional or alternative embodiments, the PGSs include compressible PGSs that provide, in the compressed state, in-plane thermal conduction and coefficient of thermal expansion (CTE) matching of the core and the top and bottom plates.

In accordance with additional or alternative embodiments, the compressed state of the PGSs is characterized in that the PGSs are compressed to a predefined degree of compression and the heat spreader further includes stoppers configured to halt further compression of the PGSs in the compression direction beyond the predefined degree of compression.

In accordance with additional or alternative embodiments, the stoppers include pedestals extending upwardly from the bottom plate and toward the top plate and the heat spreader further comprises threaded screws that extend through the top plate to threadedly engage with the pedestals to draw the top plate toward the bottom plate until the top plate impinges on the pedestals.

In accordance with additional or alternative embodiments, the threaded screws include countersunk screws and the top plate is formed to define countersunk screw-holes through which the countersunk screws extend.

In accordance with additional or alternative embodiments, the heat spreader further includes additional PGS lining the stoppers.

According to an aspect of the disclosure, a heat spreader is provided and includes a core of orthotropic material having first and second preferred directions of thermal conduction, an encapsulant and pyrolytic graphite sheets (PGSs). The PGSs are interposed in a compressed state as a thermal interface material (TIM) between the core and the encapsulant in at least a compression direction aligned with at least one of the first and second preferred directions of thermal conduction.

In accordance with additional or alternative embodiments, the orthotropic material includes annealed pyrolytic graphite (APG).

In accordance with additional or alternative embodiments, the first and second preferred directions of thermal conduction are in-plane directions of the core.

In accordance with additional or alternative embodiments, the encapsulant has a global through-thickness direction and the core is rotated such that the at least one of the first and second preferred directions of thermal conduction is aligned with the through-thickness direction.

In accordance with additional or alternative embodiments, the PGSs comprise compressible PGSs that provide, in the compressed state, in-plane thermal conduction and coefficient of thermal expansion (CTE) matching of the core and the encapsulant.

In accordance with additional or alternative embodiments, the compressed state of the PGSs is characterized in that the PGSs are compressed to a predefined degree of compression and the heat spreader further includes stoppers configured to halt further compression of the PGSs in the compression direction beyond the predefined degree of compression.

In accordance with additional or alternative embodiments, the stoppers include pedestals extending upwardly from a bottom plate of the encapsulant and toward a top plate of the encapsulant and the heat spreader further includes threaded screws that extend through the top plate to threadedly engage with the pedestals to draw the top plate toward the bottom plate until the top plate impinges on the pedestals.

In accordance with additional or alternative embodiments, the threaded screws include countersunk screws and the top plate is formed to define countersunk screw-holes through which the countersunk screws extend.

In accordance with additional or alternative embodiments, the heat spreader further includes additional PGS lining the stoppers.

According to an aspect of the disclosure, a method of assembling a heat spreader is provided. The method includes providing a core of orthotropic material having first and second preferred directions of thermal conduction, arranging the core between top and bottom plates in a compression direction aligned with at least one of the first and second preferred directions of thermal conduction, interposing pyrolytic graphite sheets (PGSs) between the core and the top plate and between the core and the bottom plate in a compression direction and compressing the PGSs to a compressed state such that the PGSs provide a thermal interface material (TIM) between the core and the top plate and between the core and the bottom plate.

In accordance with additional or alternative embodiments, the PGSs include compressible PGSs that provide, in the compressed state, in-plane thermal conduction and coefficient of thermal expansion (CTE) matching of the core and the top and bottom plates, the compressed state of the PGSs is characterized in that the PGSs are compressed to a predefined degree of compression and the method further includes halting further compression of the PGSs in the compression direction beyond the predefined degree of compression.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, pyrolytic graphite sheet (PGS) material is used as a thermal interface material (TIM) between a bulk annealed pyrolytic graphite (APG) spreader and encapsulant. This allows for optimized APG preferred directions that balances compression and CTE mismatch while using a bolted joint design. The use of PGS material as a TIM leads to reduced fabrication complexity by avoiding hot isostatic press (HIP) operations or active solder welding processes and allows for expanded use of highly thermally conductive APG in product lines. In the resulting structure, one or more continuous or discontinuous PGSs can be used to join bulk thermal pyrolytic graphite (TPG) in a heat spreader with aluminum top and bottom clamping plates providing encapsulation. The APG orientation is optimized for heat transfer between the source and sink and for spreading in the bulk material with the two preferred directions in the spreader through thickness direction and one in-plane direction. PGS preferred directions are in the spreader in-plane direction, with the design goal of providing some spreading relief in the TPG unpreferred direction. Tight tolerances for wall and pedestal features control PGS compression and the encapsulated APG is sealed from the environment to protect from corrosion.

Figure 1:
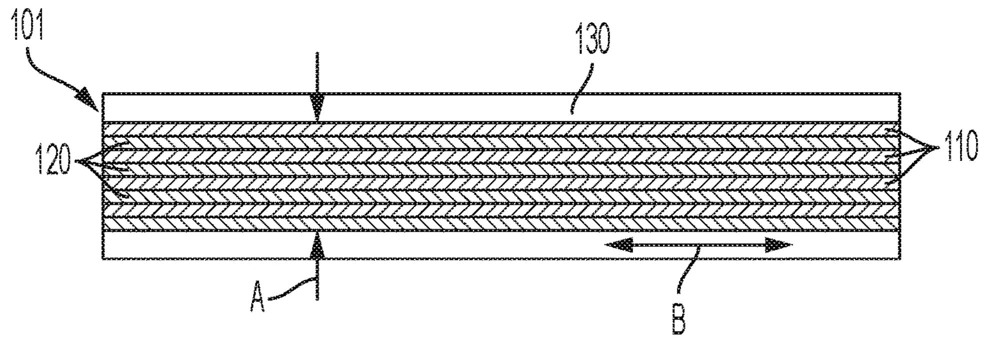
FIG. 1 is a schematic side view of a heat spreading element in accordance with embodiments.

With reference to FIG. 1, a heat spreading element 101 is provided and includes compressible PGS 110 and rigid PGS 120. The rigid PGS 120 are interleaved with the compressible PGS 110. At least one of the compressible PGS 110 and the rigid PGS 120 exhibits in-plane thermal conductivity of greater than about 1000 W/m-K. The compressible PGS 110 and the rigid PGS 120 are much less dense than metallic material, such as copper. For example, a density of the rigid PGS 120 can be less than about 10%-15% of a density of metallic material. A density of the compressible PGS 110 can be less than about 10%-15% and, in some cases, less than about 5% a density of metallic material. The compressible PGS 110 and the rigid PGS 120 can be compressed together by, e.g., a clamp 130, in an interleaving direction A. This compression effectively activates the in-plane thermal conductivity of the compressible PGS 110 and the rigid PGS 120 so that the heat spreading element 101 can provide for a transfer of heat in a first direction (i.e., the interleaving direction A) and can spread the heat out in a second direction (i.e., an in-plane direction B).

In accordance with embodiments, the rigid PGS 120 can have a density of about 1200-1300 kg/m3 and the compressible PGS 110 can have a spongy quality with a density of about 400-500 kg/m3.

Figure 2:
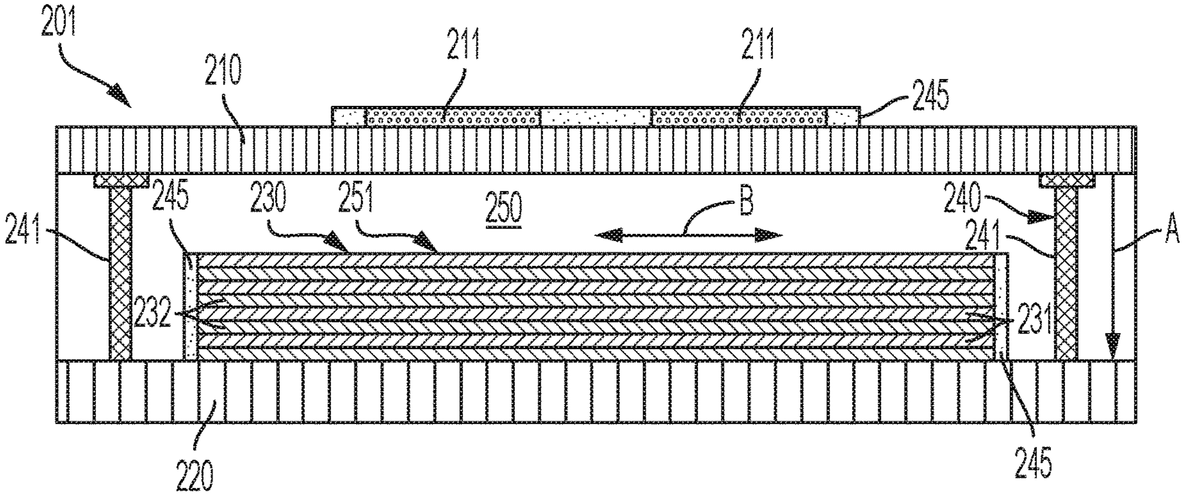
FIG. 2 is a schematic side view of a heat spreader with a heat spreading element in accordance with embodiments.

With reference to FIG. 2, a heat spreader 201 is provided and includes a module 210, which includes electronics 211 that generate heat during operations thereof, a heat exchanger or cold plate (hereinafter referred to as a "cold plate") 220 that is configured to draw and dissipate the heat generated by the electronics 211, a heat spreading element 230 and a clamp 240. The heat spreading element 230 includes compressible PGS 231 and rigid PGS 232 that are interleaved with the compressible PGS 231. At least one of the compressible PGS 231 and the rigid PGS 232 exhibits in-plane thermal conductivity of greater than about 1000 W/m-K. The compressible PGS 231 and the rigid PGS 232 are much less dense than metallic material, such as copper. For example, a density of the rigid PGS 120 can be less than about 10%-15% of a density of metallic material. A density of the compressible PGS 110 can be less than about 10%-15% and, in some cases, less than about 5% a density of metallic material.

As above, in accordance with embodiments, the rigid PGS 232 can have a density of about 1200-1300 kg/m3 and the compressible PGS 231 can have a spongy quality with a density of about 400-500 kg/m3.

Figure 3:
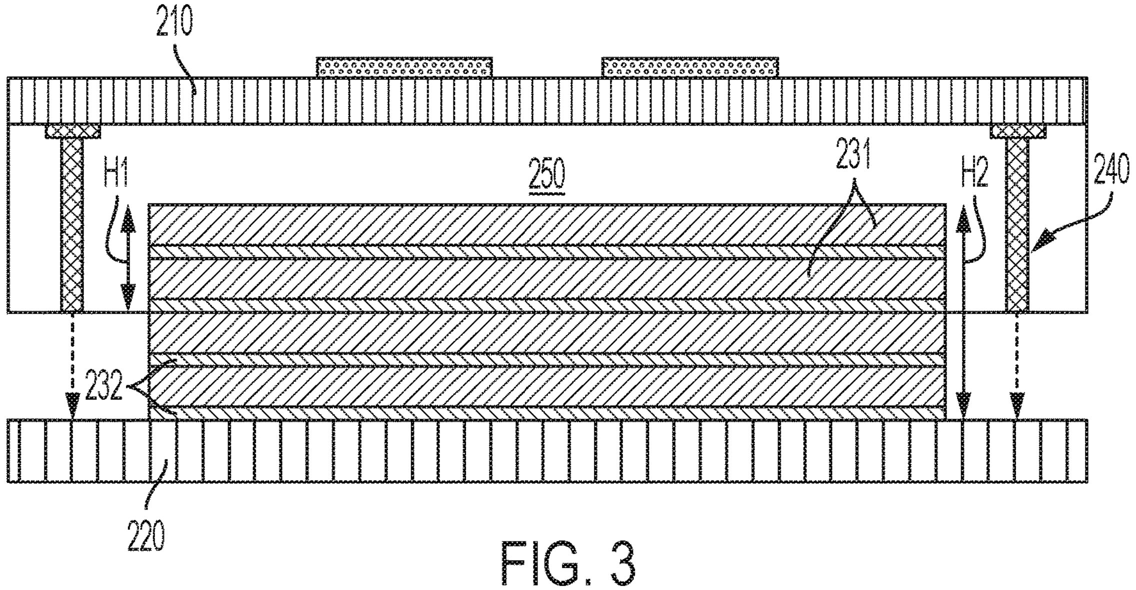
FIG. 3 is a graphical illustration of an assembly of the heat spreader and the heat spreading element of FIG. 2 in accordance with embodiments.

The heat spreading element 230 is interposed between the module 210 and the cold plate 220 to provide for a transfer of the heat generated by the electronics 211 from the module 210 to the cold plate 220 in a first direction (i.e., an interleaving direction A with respect to the interleaving direction of the compressible PGS 231 and the rigid PGS 232). The heat spreading element 230 also spreads the heat out in a second direction (i.e., an in-plane direction B of the compressible PGS 231 and the rigid PGS 232) transverse with respect to the first direction. The clamp 240 can include screws 241 that are engageable with at least the cold plate 220 to draw the cold plate 220 toward the module 210. The clamp 240 can alternatively include or be provided with various other configurations that serve to draw the cold plate 220 toward the module 210. In any case, the clamp 240 serves to clamp the heat spreading element 230 between the module 210 and the cold plate 220 and to compress the compressible PGS 231 and the rigid PGS 232 in the first direction or the interleaving direction A (FIG. 3 illustratively shows that only the compressible PGS 231 are compressed; this is done for clarity and is not necessarily the case). This compression of the compressible PGS 231 and the rigid PGS 232 effectively activates the in-plane thermal conductivity of the compressible PGS 231 and the rigid PGS 232.

In accordance with embodiments, the clamp 240 can be used to compress the compressible PGS 231 and the rigid PGS 232 to tune contact resistances between the compressible PGS 231 and the rigid PGS 232. This can optimize thermal performance of the heat spreading element 230 in general and to optimize thermal performance and the in-plane thermal conductivity of the compressible PGS 231 and the rigid PGS 232.

In accordance with further or alternative embodiments, it is to be understood that the compressible PGS 231 and the rigid PGS 232 need not be interleaved with one another in a 1:1 sequence and that other configurations are possible. These include configurations in which only the compressible PGS 231 are provided and/or configurations in which multiple compressible PGS 232 are interleaved with singular rigid PGS 232.

As shown in FIG. 2, the heat spreader 201 can also include a monolithic metallic element 250 interposed between the module 210 and the cold plate 220 with the heat spreading element 230. The monolithic metallic element 250 can be formed of a metallic material, such as copper or another suitable metal or metallic alloy. The monolithic metallic element 250 can be provided in a number of configurations but is generally provided as a single, unitary element that is formed to define a pocket 251 in which the heat spreading element 230 is disposable. In this sense, the monolithic metallic element 250 can also engage with or be engaged by the clamp 240.

With continued reference to FIG. 2, the heat spreader 201 can also include seals 245. The seals 245 can assume any size, shape and dimension for use with the heat spreader 201. In some, but not all cases, the seals 245 can be disposed and configured to prevent moisture ingress into the heat spreading element 230. In some other cases, the seals 245 can also be disposed and configured to prevent moisture from flowing around the clamp 240 and then into the heat spreading element 230.

With reference to FIG. 3 and in accordance with embodiments, a height H1 of the pocket 251 can be less than a height H2 of the heat spreading element 230 prior to the compressible PGS 231 and the rigid PGS 232 being compressed. Thus, as above, the height H1 of the pocket 251 can be tuned along with the clamp 240 to compress the compressible PGS 231 and the rigid PGS 232 to optimize thermal performance of the heat spreading element 230. That is, where the compressible PGS 231 and the rigid PGS 232 are compressed from the height H2 to the height H1 of the pocket 251, this degree of compression optimizes the thermal performance of the heat spreading element 230.

In accordance with embodiments, a degree of compression can be about 5-60% of the height H2.

The compressibility of the compressible PGS 231 can provide for coefficient of thermal expansion (CTE) mismatch compliance among at least two or more of the module 210, the monolithic metallic element 250, the rigid PGS 232, and the cold plate 220.

Figure 4:
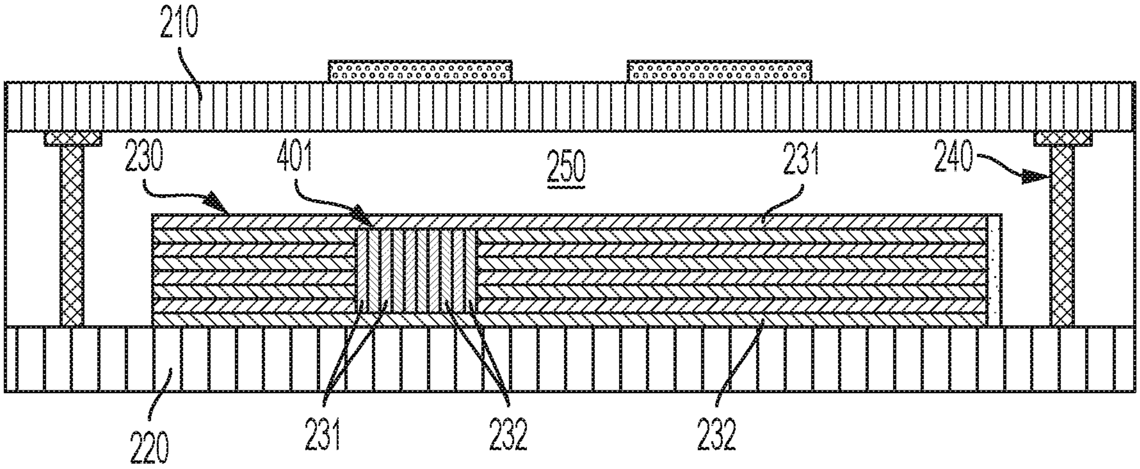
FIG. 4 is a side schematic view of a heat spreader with a heat spreading element and a transverse section in accordance with embodiments.

With reference to FIG. 4 and in accordance with further embodiments, the heat spreading element 230 of FIGS. 2 and 3 can be provided in hybridized configurations, arrangements and formations. For example, as shown in FIG. 4, the heat spreading element 230 can include the compressible PGS 231 and the rigid PGS 232 as well as a transverse section 401. This transverse section 401 can be, but is not required to be, provided within the heat spreading element 230 and can include the compressible PGS 231 and the rigid PGS 232. The compressible PGS 231 and the rigid PGS 232 of the transverse section 401 are oriented or otherwise turned transversely or perpendicularly with respect to a rest of the heat spreading element 230. In this way, the transverse section 401 can function like a via for heat spreading in through-thickness directions (in addition to the in-plane heat spreading of the compressible PGS 231 and the rigid PGS 232). The compressible PGS 231 and the rigid PGS 232 of the transverse section 401 can be compressed (i.e., by the rest of the heat spreading element 230) and thus can provide for a high degree of in-plane thermal conduction between the module 210 and the cold plate 220. This transverse section 401 can be disposed at or near a hot spot of the module 210.

Although the transverse section 401 is illustrated in FIG. 4 as being sandwiched between a compressible PGS 231 and a rigid PGS 232, it is to be understood that this is not required and that other embodiments are possible. For example, the traverse section 401 could be in direct contact with one or both of the cold plate 220 and the monolithic metallic element 250.

Figure 5:
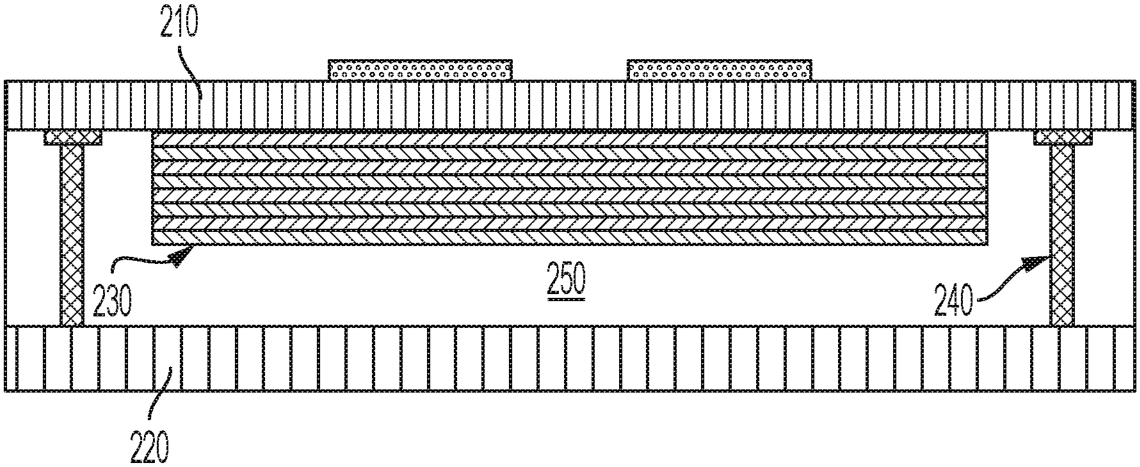
FIG. 5 is a side schematic view of a heat spreader with a heat spreading element in accordance with alternative embodiments.
Figure 6:
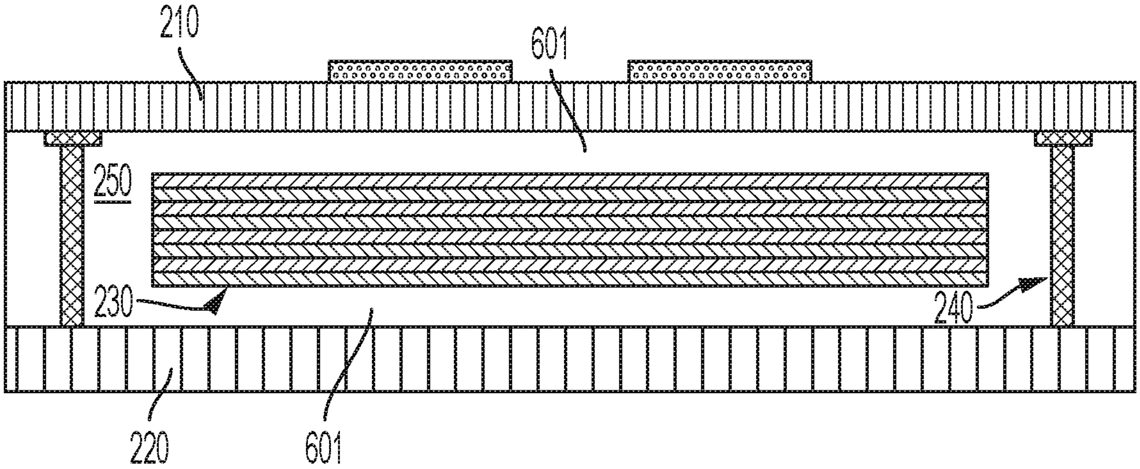
FIG. 6 is a side schematic view of a heat spreader with a heat spreading element in accordance with alternative embodiments.
Figure 7:
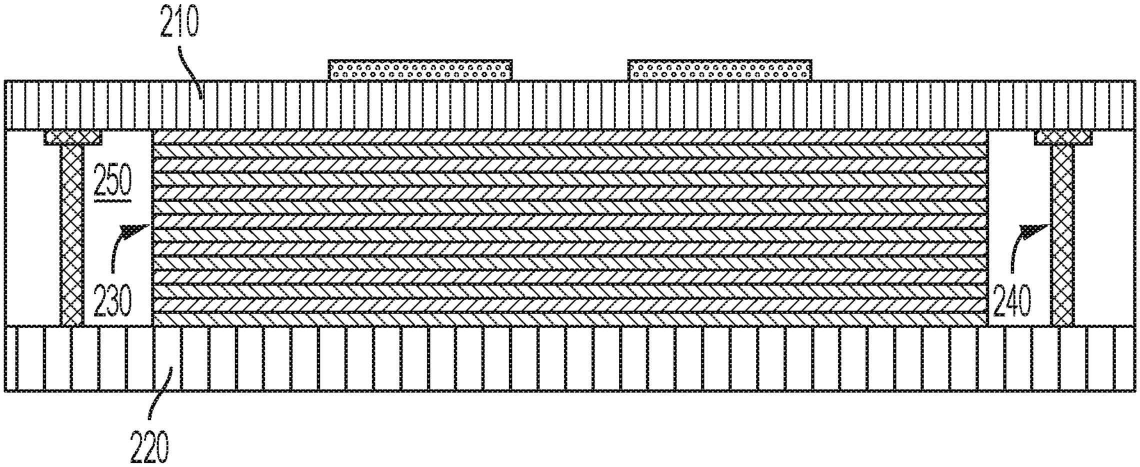
FIG. 7 is a side schematic view of a heat spreader with a heat spreading element in accordance with alternative embodiments.

With reference to FIGS. 5-7 and in accordance with further embodiments, the monolithic metallic element 250 can be formed such that the pocket 251 can have multiple varied configurations. For example, while the pocket 251 of FIGS. 2 and 3 is adjacent to the cold plate 220, the pocket 251 could be adjacent to the module 210 (see FIG. 5), the pocket 251 could be sandwiched on each side by portions 601 of the monolithic metallic element 250 (see FIG. 6) or the pocket 251 could extend through an entire span of the distance between the module 210 and the cold plate 220 (see FIG. 7).

Figure 8:
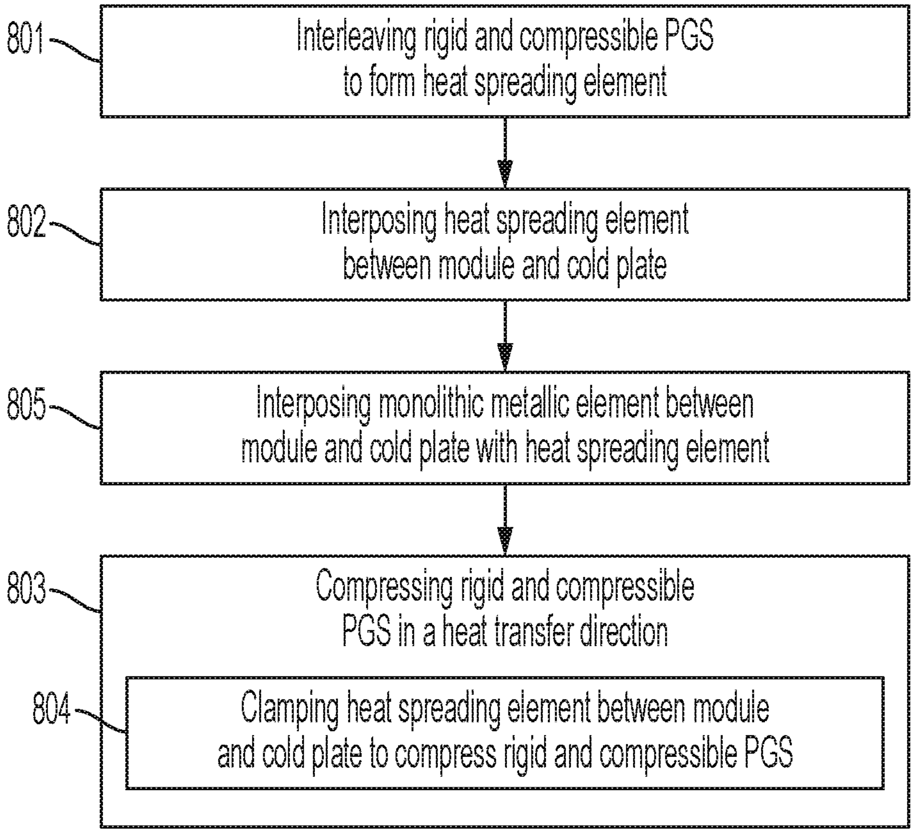
FIG. 8 is a flow diagram illustrating a method of assembling a heat spreading in accordance with embodiments.

With reference to FIG. 8, a method of assembling a heat spreader, such as the heat spreader 201 described above, is provided. As shown in FIG. 8, the method includes interleaving rigid PGS with compressible PGS to form a heat spreading element to provide for a transfer of heat and to spread the heat out (block 801) and compressing the compressible PGS and the rigid PGS in a direction of the transfer of the heat (block 802). In accordance with embodiments, the method can further include interposing the heat spreading element between a module and a cold plate to provide for the transfer of heat from the module to the cold plate in a first direction and to spread the heat out in a second direction transverse with respect to the first direction (block 803). In addition, the compressing can include clamping the heat spreading element between the module and the cold plate to compress the compressible PGS and the rigid PGS in the first direction (block 804). The method can further include interposing a monolithic metallic element between the module and the cold plate with the heat spreading element (block 805).

Figure 9:
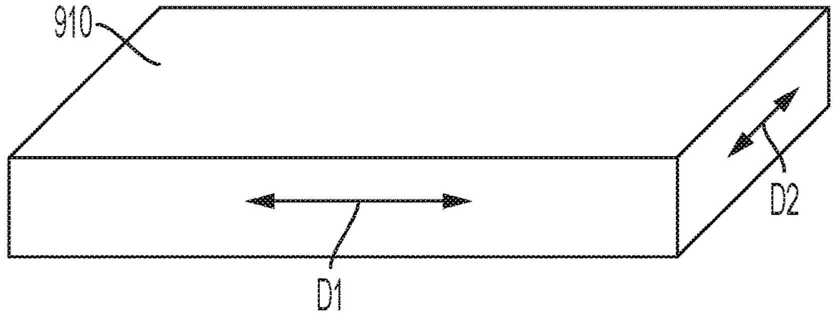
FIG. 9 is a perspective view of annealed pyrolytic graphite (APG) in accordance with embodiments of the invention.
Figure 10:
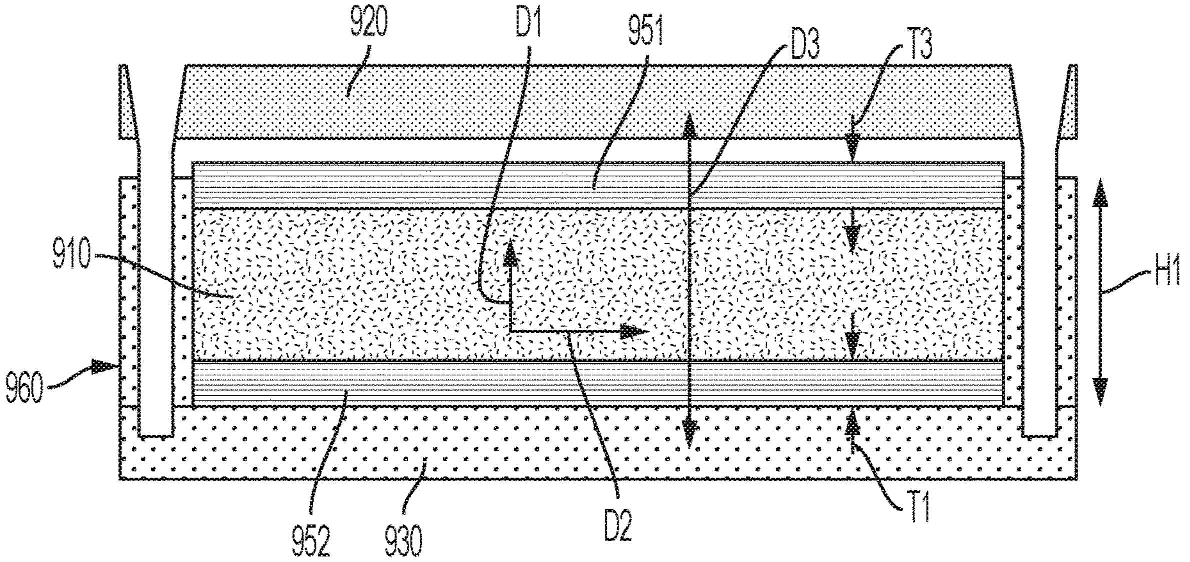
FIG. 10 is a side view of an unassembled heat spreader including the APG of FIG. 9 in accordance with embodiments.
Figure 11:
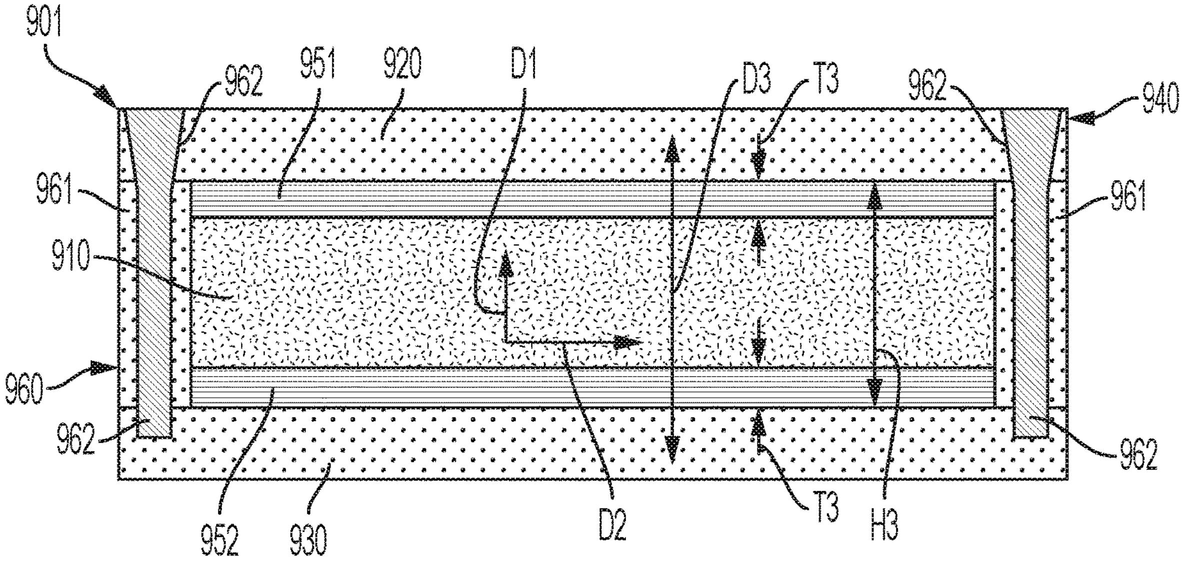
FIG. 11 is a side view of a heat spreader including the APG of FIG. 9 in an assembled state in accordance with embodiments.

With reference to FIGS. 9-11, a heat spreader 901 (see FIG. 10) is provided and includes a core 910. The core 910 is made of orthotropic material, which, by definition, has first and second preferred directions of thermal conduction D1 and D2, such as annealed pyrolytic graphite (APG). The heat spreader 901 further includes a top plate 920 and a bottom plate 930 that can be provided as part of an encapsulant 940 (see FIG. 11) which includes additional external structures and sidewalls. The top plate 920 and the bottom plate 930 (and the encapsulant 940 as a whole) can be made of various materials including, but not limited to, metallic materials or alloys like aluminum and copper. The heat spreader 901 also includes first PGSs 951 and second PGSs 952. The first PGSs 951 can be interposed in a compressed state as a TIM between the core 910 and the top plate 920 in a compression direction that is aligned with at least one of the first and second preferred directions of thermal conduction D1 and D2 (e.g., D2). The second PGSs 952 can be interposed in a compressed state as a TIM between the core 910 and the bottom plate 930 in the compression direction that is aligned with the at least one of the first and second preferred directions of thermal conduction D1 and D2 (again, e.g., D2).

For purposes of clarity and brevity, the following description will relate to the case in which the compression direction is aligned with the first preferred direction of thermal conduction D1.

As shown in FIG. 9, the core 910 is provided as a volumetric body of the orthotropic material with the first and second preferred directions of thermal conduction D1 and D2 being in-plane directions of the core 910. As shown in FIG. 10, the top plate 920 and the bottom plate 930 are aligned in a through-thickness direction D3 and that the core 910 is rotated such that the first preferred direction of thermal conduction D1 is aligned with the through-thickness direction D3.

The first PGSs 951 and the second PGSs 952 include or are provided as compressible PGSs that provide, in the compressed state, relatively high rates of in-plane thermal conduction and coefficient of thermal expansion (CTE) matching compliance of the core 910 and each of the top plate 920 and the bottom plate 930. As used herein, the compressed state of the first PGSs 951 and the second PGSs 952 is characterized in that the first PGSs 951 and the second PGSs 952 are compressed to a predefined degree of compression.

With this description, the heat spreader 901 also includes stoppers 960 that are configured to halt further compression of the first PGSs 951 and of the second PGSs 952 in the compression direction (i.e., the first preferred direction of thermal conduction D1 and the through-thickness direction D3) beyond the predefined degree of compression. The stoppers 960 can include or be provided as pedestals 961 that extend upwardly from the bottom plate 930 and toward the top plate 920. The heat spreader 901 further comprises threaded screws 962 that extend through the top plate 920 to threadedly engage with the pedestals 961 to draw the top plate 920 toward the bottom plate 930 until the top plate 920 impinges on the pedestals 961. In accordance with embodiments, the threaded screws 961 can include or be provided as countersunk screws and the top plate 920 is formed to define countersunk screw-holes 962 through which the countersunk screws extend.

During assembly of the heat spreader 901, as shown in FIG. 10, initial thicknesses T1 of the first PGSs 951 and the second PGSs 952 are such that a total thickness T2 of the core 910, the first PGSs 951 and the second PGSs 952 exceeds a height H1 of the top plate 920 above the bottom plate 930 (i.e., a height of the stoppers 960). However, as shown in FIG. 11, once the top plate 920 is assembled onto the stoppers 960, the first PGSs 951 and the second PGSs 952 are compressed to secondary thicknesses T3 such that a total compressed thickness of the core 910 and the first PGSs 951 and the second PGSs 952 in the compressed state is equal to the height H1 (compression of the core 910 in the first preferred direction of thermal conduction D1 occurs but is minimal relative to the degree of compression of the first PGSs 951 and the second PGSs 952). The dimensions of the stoppers 960 are set in accordance with this desired effect.

Figure 12:
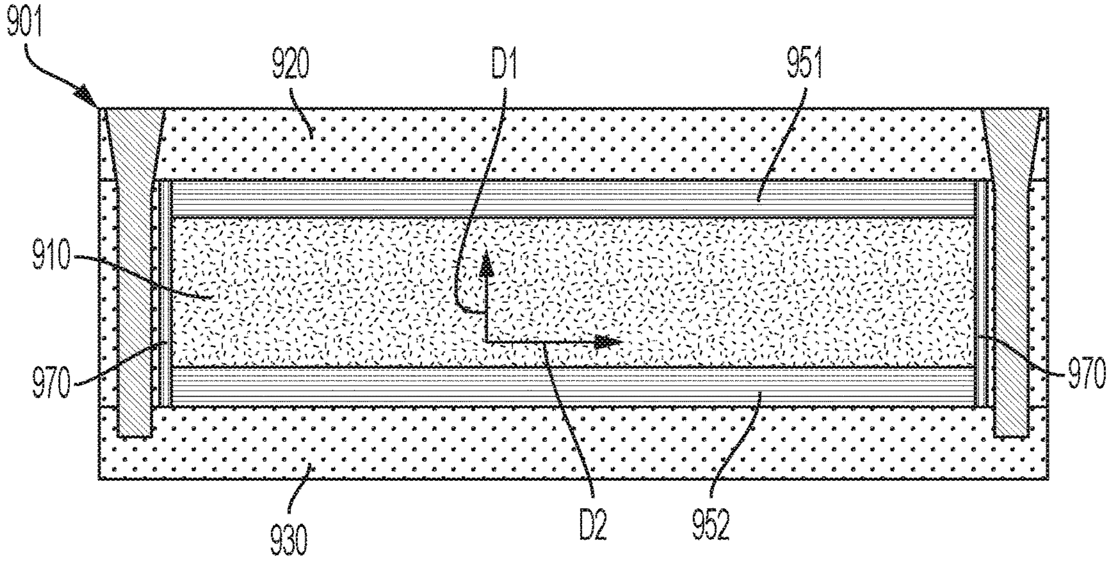
FIG. 12 is a side view of a heat spreader including the APG of FIG. 9 and PGS lining stoppers in an assembled state in accordance with embodiments.

With reference to FIG. 12, the heat spreader 901 can include additional PGS 970 disposed and configured to line the stoppers 960.

As described above, the core 910, the first and second PGSs 951 and 952 and the additional PGS 970 exhibit in-plane thermal conductivity of greater than about 1000 W/m-K or about ~400-1,500 W/m-K with a density of about 428-1,200 kg/m3. As such, the heat spreader 901 is capable of heat spreading at relatively high rates in the first preferred direction of thermal conduction D1 and the through-thickness direction D3 (owing to the rotation of the core 910 relative to the global frame of reference for the top plate 920 and the bottom plate 930 (and the encapsulant 940). The heat spreader 901 is also capable of heat spreading at the relatively high rates in the second preferred direction of thermal conduction D2 of the core 910 and of the in-plane thermal conduction of the first PGSs 951 and the second PGS 952 as well as the additional PGSs 960.

Figure 13:
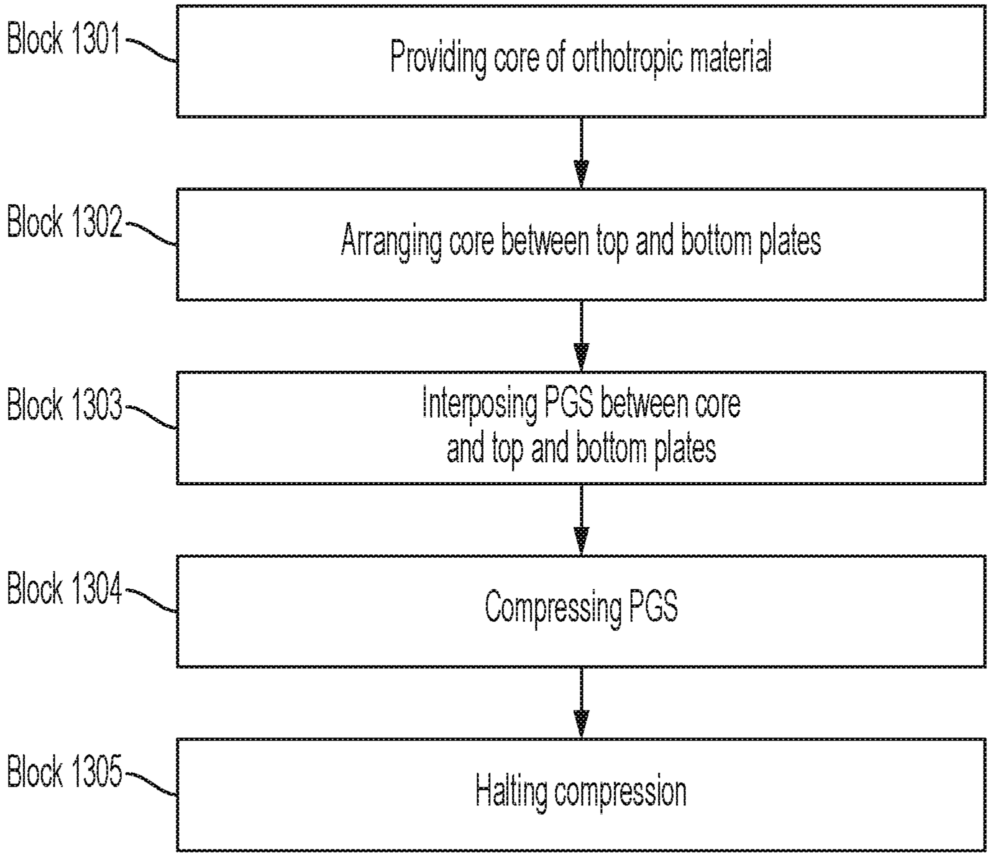
FIG. 13 is a flow diagram illustrating a method of assembling a heat spreader including APG in accordance with embodiments.

With reference to FIG. 13, a method of assembling a heat spreader, such as to the heat spreader 901 of FIGS. 9-12, is provided. The method includes providing a core of orthotropic material having first and second preferred directions of thermal conduction (block 1301), arranging the core between top and bottom plates in a compression direction aligned with at least one of the first and second preferred directions of thermal conduction (block 1302), interposing PGSs between the core and the top plate and between the core and the bottom plate in a compression direction (block 1303) and compressing the PGSs to a compressed state such that the PGSs provide a TIM between the core and the top plate and between the core and the bottom plate (block 1304). The PGSs include or are provided as compressible PGSs that provide, in the compressed state, in-plane thermal conduction and CTE matching of the core and the top and bottom plates. The compressed state of the PGSs is characterized in that the PGSs are compressed to a predefined degree of compression. The method further includes halting further compression of the PGSs in the compression direction beyond the predefined degree of compression (block 1305).

Technical effects and benefits of the present disclosure are the provision of compressible PGSs that can be used as a TIM between an APG core and encapsulant providing a low thermal resistance contact and a compliant connection that limits thermal expansion induced strains.

The corresponding structures, materials, acts, and equivalents of all means or step-plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A heat spreader, comprising:

a core of orthotropic material having a preferred direction of thermal conduction; a top plate;

a bottom plate;

stoppers disposed on the bottom plate in a compression direction;

screws; and pyrolytic graphite sheets (PGSs) interposed in the compression direction between the core and the top plate and between the core and the bottom plate, wherein:

the preferred direction of thermal conduction and the compression direction are aligned and a total height of the core and the PGSs in the compression direction exceeds a corresponding height of the stoppers with the PGSs uncompressed, and the screws engage with the stoppers such that the top plate impinges on the stoppers and the PGSs are compressed whereby the PGSs act as a thermal interface material (TIM) between the core and the top plate and between the core and the bottom plate in the compression direction aligned with the preferred direction of thermal conduction, wherein the heat spreader further comprises additional PGS lining the stoppers and oriented to lie along the compression direction.

2. The heat spreader according to claim 1, wherein the orthotropic material comprises annealed pyrolytic graphite (APG).

3. The heat spreader according to claim 1, wherein the PGSs comprise compressible PGSs that, when compressed, provide in-plane thermal conduction.

4. The heat spreader according to claim 1, wherein: the PGSs are compressed to a predefined degree of compression, and the stoppers halt further compression of the PGSs in the compression direction beyond the predefined degree of compression.

5. The heat spreader according to claim 4, wherein:

the stoppers are pedestals extending upwardly from the bottom plate and toward the top plate, and the screws are threaded screws that extend through the top plate to threadedly engage with the pedestals to draw the top plate toward the bottom plate until the top plate impinges on the pedestals.

6. The heat spreader according to claim 5, wherein: the threaded screws are countersunk screws, and the top plate is formed to define countersunk screw-holes through which the countersunk screws extend.

7. A heat spreader, comprising:

a core of orthotropic material having a preferred direction of thermal conduction; an encapsulant; and pyrolytic graphite sheets (PGSs) interposed between the core and the encapsulant in a compression direction aligned with the preferred direction of thermal conduction, the PGSs being compressed by the encapsulant to a compressed state to act as a thermal interface material (TIM) between the core and the encapsulant in the compression direction, wherein:

the compressed state of the PGSs is characterized in that the PGSs are compressed to a predefined degree of compression, the heat spreader further comprises stoppers configured to halt further compression of the PGSs in the compression direction beyond the predefined degree of compression, and the heat spreader further comprises additional PGS lining the stoppers and oriented to lie along the compression direction.

8. The heat spreader according to claim 7, wherein the orthotropic material comprises annealed pyrolytic graphite (APG).

9. The heat spreader according to claim 7, wherein the PGSs comprise compressible PGSs that, when compressed, provide in-plane thermal conduction.

10. The heat spreader according to claim 7, wherein:

the stoppers are pedestals extending upwardly from a bottom plate of the encapsulant and toward a top plate of the encapsulant, and the heat spreader further comprises threaded screws that extend through the top plate to threadedly engage with the pedestals to draw the top plate toward the bottom plate until the top plate impinges on the pedestals.

11. The heat spreader according to claim 10, wherein: the threaded screws are countersunk screws, and the top plate is formed to define countersunk screw-holes through which the countersunk screws extend.

12. A method of assembling a heat spreader, the method comprising:

providing a core of orthotropic material having a preferred direction of thermal conduction;

arranging the core between top and bottom plates in a compression direction aligned with the preferred direction of thermal conduction;

interposing pyrolytic graphite sheets (PGSs) between the core and the top plate and between the core and the bottom plate in the compression direction; and forming, around the core and the PSGs, an encapsulant comprising the top and bottom plates and stoppers disposed on the bottom plate and with which the top plate impinges, wherein:

following the interposing and prior to the forming, the PSGs are in an uncompressed state, the forming of the encapsulant comprises compressing the PGSs to a compressed state such that the PGSs provide a thermal interface material (TIM) between the core and the top plate and between the core and the bottom plate, and the method further comprises wherein the heat spreader further comprises lining the stoppers with additional PGS oriented to lie along the compression direction.

13. The method according to claim 12, wherein:

the PGSs comprise compressible PGSs that, when compressed, provide in-plane thermal conduction, the compressed state of the PGSs is characterized in that the PGSs are compressed to a predefined degree of compression, and the method further comprises halting further compression of the PGSs in the compression direction beyond the predefined degree of compression.

* * * * *